US 9,679,655 B2

(12) United States Patent
Polizzi et al.

(10) Patent No.: US 9,679,655 B2
(45) Date of Patent: Jun. 13, 2017

(54) ROW DECODER FOR A NON-VOLATILE MEMORY DEVICE, AND NON-VOLATILE MEMORY DEVICE

(71) Applicant: STMicroelectronics S.r.l, Agrate Brianza (IT)

(72) Inventors: Salvatore Polizzi, Palermo (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/140,770

(22) Filed: Apr. 28, 2016

(65) Prior Publication Data

US 2017/0062055 A1 Mar. 2, 2017

(30) Foreign Application Priority Data

Aug. 26, 2015 (IT) .......................... 102015000046618

(51) Int. Cl.
*G11C 16/08* (2006.01)
*G11C 16/10* (2006.01)
*G11C 16/32* (2006.01)

(52) U.S. Cl.
CPC .............. *G11C 16/10* (2013.01); *G11C 16/08* (2013.01); *G11C 16/32* (2013.01)

(58) Field of Classification Search
CPC ................................ G11C 16/08; G11C 16/10
USPC ........................................ 365/185.23, 185.24
See application file for complete search history.

(56) References Cited

U.S. PATENT DOCUMENTS

| 4,360,901 | A |   | 11/1982 | Proebsting |            |
|-----------|---|---|---------|------------|------------|
| 5,729,493 | A | * | 3/1998  | Morton     | G11C 7/12  |
|           |   |   |         |            | 365/185.21 |
| 5,949,731 | A | * | 9/1999  | Tsukude    | G11C 5/00  |
|           |   |   |         |            | 365/149    |
| 6,026,047 | A | * | 2/2000  | Ryu        | G11C 8/08  |
|           |   |   |         |            | 365/185.23 |
| 6,122,200 | A |   | 9/2000  | Campardo et al. |       |
| 6,456,530 | B1|   | 9/2002  | Micheloni et al. |      |

(Continued)

OTHER PUBLICATIONS

Campardo, G. et al., "Progettazione di Memorie Non Volatili (Design of non-volatile memories)," Franco Angeli, 2nd edition, Feb. 9, 2002, pp. 199-205.

(Continued)

*Primary Examiner* — Michael Tran
(74) *Attorney, Agent, or Firm* — Slater Matsil, LLP

(57) ABSTRACT

A non-volatile memory device includes a memory array having memory cells arranged in wordlines and receiving a supply voltage. A row decoder includes an input and pre-decoding module, which is configured to receive address signals and generate pre-decoded address signals at low voltage, in the range of the supply voltage. A driving module is configured to generate biasing signals for biasing the wordlines of the memory array starting from decoded address signals, which are a function of the pre-decoded address signals, at high voltage and in the range of a boosted voltage higher than the supply voltage. A processing module is configured to receive the pre-decoded address signals and to jointly execute an operation of logic combination and an operation of voltage boosting of the pre-decoded address signals for generation of the decoded address signals.

23 Claims, 4 Drawing Sheets

(56) References Cited

U.S. PATENT DOCUMENTS

| | | | |
|---|---|---|---|
| 8,913,436 B2 * | 12/2014 | Sanjeevarao | G11C 16/08 |
| | | | 365/185.23 |
| 9,159,425 B2 * | 10/2015 | Rana | G11C 16/0433 |
| 2001/0053093 A1 | 12/2001 | Ogura et al. | |
| 2007/0217280 A1 | 9/2007 | Kumala | |
| 2010/0302894 A1 | 12/2010 | Takahashi et al. | |
| 2012/0163115 A1 | 6/2012 | Ghosh et al. | |
| 2014/0043929 A1 | 2/2014 | Jang | |
| 2014/0204676 A1 | 7/2014 | Kim et al. | |
| 2014/0247081 A1 | 9/2014 | Yeung et al. | |

OTHER PUBLICATIONS

Cappelletti, P. et al., "Flash Memories," Kluwer Academic Publishers, Jun. 30, 1999, pp. 257-259.

* cited by examiner

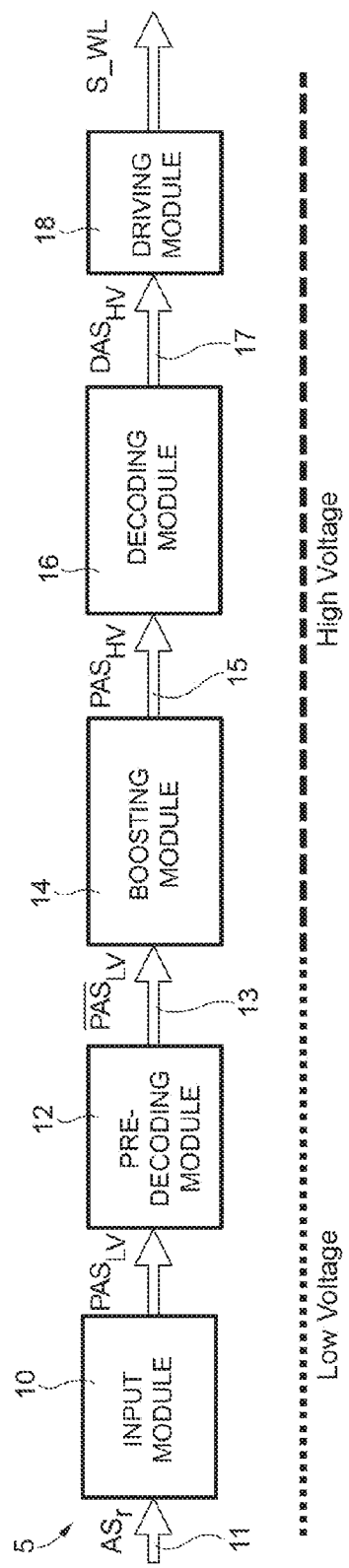
PRIOR ART FIG. 2
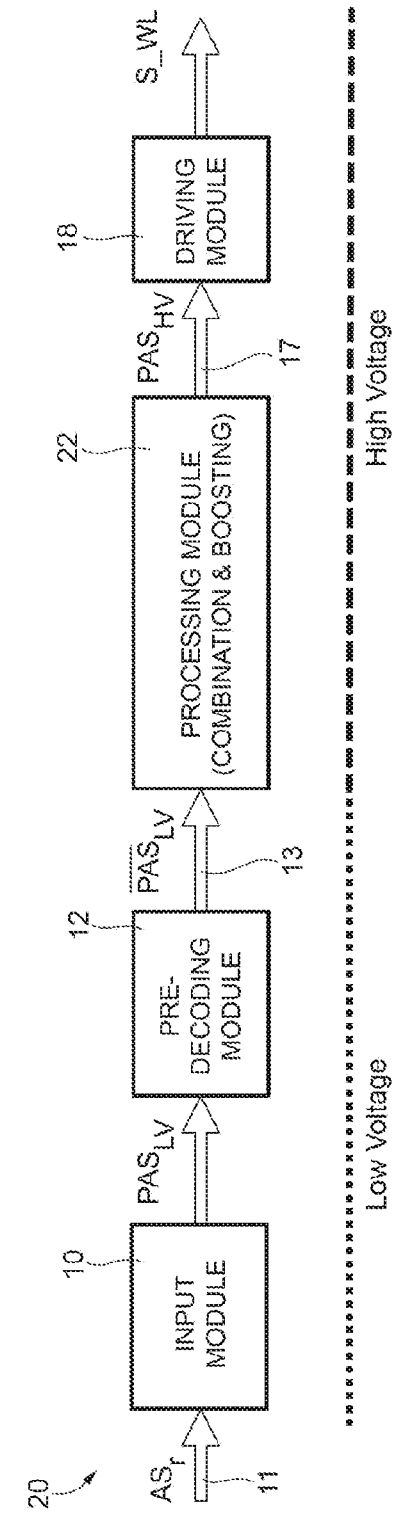
FIG. 3

ROW DECODER FOR A NON-VOLATILE MEMORY DEVICE, AND NON-VOLATILE MEMORY DEVICE

This application claims priority to Italian Patent Application No. 102015000046618, filed on Aug. 26, 2015, which application is hereby incorporated herein by reference.

TECHNICAL FIELD

The present invention relates to a row decoder for a non-volatile memory device, in particular of a flash type, for addressing and biasing the rows of the corresponding memory array. The present invention further regards a corresponding non-volatile memory device, in particular of a flash type.

BACKGROUND

In a known way, and as illustrated schematically in FIG. 1, a non-volatile memory device, designated by 1, for example of a NAND or NOR flash type, in general comprises a memory array 2 made up of a plurality of memory cells 3, arranged in rows (wordlines WL) and columns (data lines, or bitlines BL).

Each memory cell 3 is constituted by a storage element formed by a floating-gate transistor, with its gate terminal designed to be coupled to a respective wordline WL, a first conduction terminal designed to be coupled to a respective bitline BL, and a second conduction terminal connected to a reference potential (for example, to ground, GND). In particular, the gate terminals of the memory cells 3 of a same wordline WL are connected together.

In a way not illustrated, the memory array 2 is generally arranged in a plurality of sectors, each of which comprises a plurality of memory cells 3. Each sector has a plurality of respective wordlines WL, distinct from those of the other sectors and physically connected to the memory cells 3 present in the same sector.

A column decoder 4 and a row decoder 5 enable selection, on the basis of address signals received at an input (generated in a per se known manner and denoted in general by AS, $AS_r$ for the rows and $AS_c$ for the columns), of the memory cells 3, and in particular of the corresponding wordlines WL and bitlines BL, each time addressed in the various sectors, enabling biasing thereof at appropriate voltage and current values during memory operations.

The column decoder 4 may further be configured to provide internally two paths to the bitlines BL of the memory array 2 each time selected. A reading path is designed to define a conductive path between the selected bitline BL and a sense-amplifier stage 7, which designed to compare the current circulating in the addressed memory cell 3 with a reference current in order to determine the datum stored. A programming path is designed to define a conductive path between the selected bitline BL and a driving stage 8, configured to supply required biasing quantities.

In the specific case of the non-volatile memories of a flash type, it is known that memory operations require high values of the biasing voltage applied to the wordlines WL, for example a high voltage of 4.5 V, during the reading operations. These values of the biasing voltages are generated within the memory device by charge-pump stages, which generate a boosted voltage starting from a supply voltage Vdd, having a logic value, for example corresponding to a low voltage of 1.2 V.

The row decoder 5 thus usually has a configuration having a low-voltage portion and a high-voltage portion, which is to be coupled to the wordlines WL of the memory array 2 for supplying the required biasing quantities. Level shifters are used for shifting the low-voltage signals (for example, at 1.2 V) of the first portion of the row decoder 5 into high-voltage signals (for example, at 4.5 V) of the second portion of the same row decoder 5.

As illustrated schematically in FIG. 2, in a known embodiment, the row decoder 5 comprises an input module 10, which receives the row-address signals $AS_r$, which are digital signals having a certain number of bits, from an input-address bus 11, and appropriately groups the bits of the same row-address signals $AS_r$ into subsets in order to generate low-voltage (LV) grouped address signals $PAS_{LV}$.

The row decoder 5 further comprises a pre-decoding module 12, which receives the grouped address signals $PAS_{LV}$ and combines them logically in an appropriate way, generating pre-decoded address signals $\overline{PAS}_{LV}$, which are also at low voltage, on a first transport bus 13, which includes a certain number of lines, corresponding to each of which is a respective combination of the grouped address signals $PAS_{LV}$.

Through the aforesaid first transport bus 13, the pre-decoded address signals $\overline{PAS}_{LV}$ then reach a voltage-booster module 14, which receives at an input the same pre-decoded address signals $\overline{PAS}_{LV}$ and generates high-voltage (HV) pre-decoded address signals $PAS_{HV}$ on a second transport bus 15, which includes a number of lines corresponding to the number of lines of the first transport bus 13.

The row decoder 5 further comprises a decoding module 16, which receives the high-voltage pre-decoded address signals $PAS_{HV}$ and combines them logically in an appropriate way to generate high-voltage decoded address signals $DAS_{HV}$ on an output bus 17, which includes a number of lines corresponding to the number of wordlines WL of the addressed sector of the memory array 2. The row decoder 5 also comprises a driving module 18, which receives the decoded address signals $DAS_{HV}$ from the output bus 17 and generates appropriate high-voltage biasing signals S_WL for the respective wordlines WL of the sector of the memory array 2 in such a way as to enable addressing and biasing of the corresponding memory cells 3.

In particular, in the row decoder 5 the low-voltage portion thus includes the input module 10 and the pre-decoding module 12 (which thus operate in the low-voltage range, i.e., with voltages in the region of the supply voltage Vdd, for example 1.2 V), whereas the high-voltage portion, separated from the aforesaid low-voltage portion by the voltage-booster module 14, includes the decoding module 16 and the driving module 18 (which thus operate in the high-voltage range, i.e., with voltages in the region of the boosted voltage, for example 4.5 V).

Architectures of row decoders 5 built in a way substantially similar to what has been described are illustrated, for example, in:

P. Cappelletti, C. Golla, P. Olivo, E. Zanoni, "Flash Memories", Kluver Academic Publishers, 1999, Chapter 5.2;

G. Campardo, "Progettazione di memorie non-volatili", Franco Angeli 2002, p. 199-205.

SUMMARY

The present Applicant has realized that the row-decoding solution described previously has some limitations, in particular with respect to the speed of execution of the addressing operations of the memory array and in general to the access speed to the same memory array.

This solution envisages that all the pre-decoded address signals $\overline{PAS}_{LV}$ are elevated to a high-voltage and are then propagated through the row decoder 5 until they reach the final logic-combination module (e.g., the decoding module) and the driving module for generation of the biasing signals S_WL for the wordlines WL.

Considerable delays are associated to propagation of the high-voltage signals, and above all, to their logic combination, on account of the evolution of the signals in the wide dynamics that ranges from the reference voltage (ground) to the boosted voltage (high voltage).

Embodiments of the present invention provide a row-decoding solution that will be improved as regards the speed of the addressing operations and the access speed to the memory array.

According to the present invention, a row decoder and a corresponding non-volatile memory device are thus provided.

One embodiment specifies a row decoder for a non-volatile memory device, which includes a memory array having memory cells arranged in wordlines and receiving a supply voltage. The row decoder includes an input and pre-decoding module, which is configured to receive address signals and generate pre-decoded address signals at low voltage, in the range of the supply voltage. A driving module is configured to generate biasing signals for biasing the wordlines of the memory array starting from decoded address signals, which are a function of the pre-decoded address signals, at high voltage and in the range of a boosted voltage higher than the supply voltage. A processing module is configured to receive the pre-decoded address signals and to jointly execute an operation of logic combination and an operation of voltage boosting of the pre-decoded address signals for generation of the decoded address signals.

BRIEF DESCRIPTION OF THE DRAWINGS

For a better understanding of the present invention, preferred embodiments thereof are now described purely by way of non-limiting example, with reference to the attached drawings, wherein:

FIG. 2 shows a general block diagram of a row decoder in the memory device of FIG. 1, also of a known type;

FIG. 3 shows an overall block diagram of a row decoder for a non-volatile memory device, according to one embodiment of the present invention;

DETAILED DESCRIPTION OF ILLUSTRATIVE EMBODIMENTS

Figure 1:
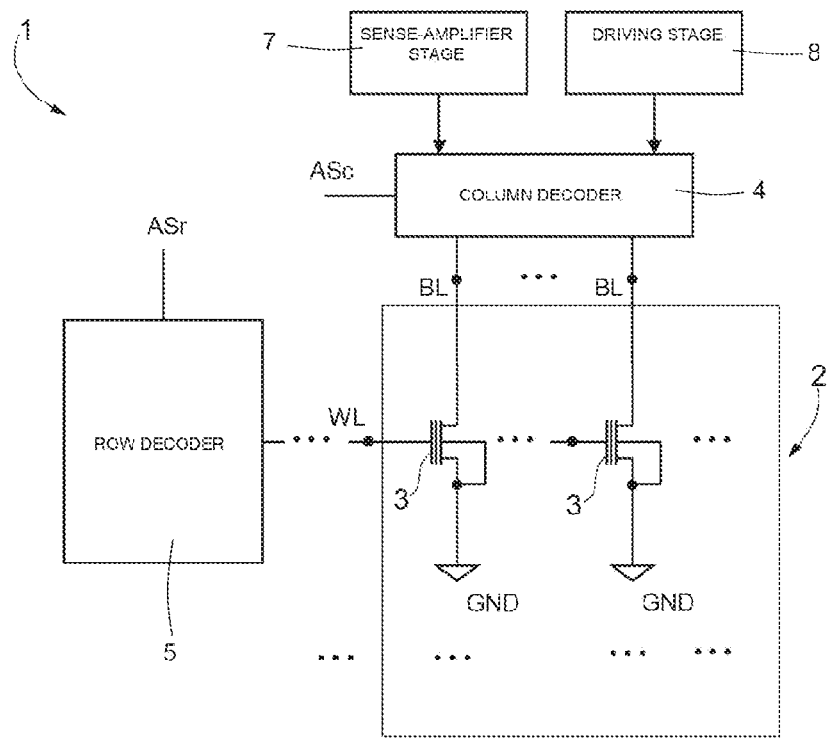
FIG. 1 shows a general block diagram of a non-volatile memory device, of a known type.

One aspect of the present solution envisages moving the operations of level shifting from low voltage to high voltage into the proximity of the final module of the row decoder, i.e., the driving module coupled at its output to the wordlines WL, in such a way as to limit propagation of high-voltage signals in the row decoder.

Furthermore, the level-shifting operations and the logic-combination operations for decoding pre-decoded address signals are combined within a single processing module of the row decoder, arranged, as highlighted previously, in close proximity of the driving module. In this way, it is possible to prevent the delays associated to evolution of the signals in the logic combination within the high-voltage range, given that the logic combination of the pre-decoded address signals still occurs at low voltage.

With reference first to FIG. 3 (where elements that are similar to others that have already been described previously are designated by the same reference numbers and will not be described again), a row decoder 20 is implemented according to an embodiment of the present solution. The input module 10, receives the row-address signals $AS_r$, from the input-address bus 11 and generates grouped address signals $PAS_{LV}$ at low-voltage (LV). The pre-decoding module 12 receives the grouped address signals $PAS_{LV}$ and logically combines them generating the pre-decoded address signals $\overline{PAS}_{LV}$, at low-voltage, on the first transport bus 13. The driving module 18 receives the decoded address signals $DAS_{HV}$, at high-voltage, from the output bus 17 and generates the biasing signals S_WL for the wordlines WL of the memory array 2 (the decoded address signals $DAS_{HV}$ originating from decoding of the pre-decoded address signals $\overline{PAS}_{LV}$).

Unlike traditional solutions, the row decoder 20 in this case comprises a single processing module 22, arranged between the pre-decoding module 12 and the driving module 18, and coupled at its input to the first transport bus 13 and at its output to the output bus 17.

In particular, the processing module 22 is configured to jointly execute the required operations of logic-combination of the low-voltage pre-decoded address signals $\overline{PAS}_{LV}$ and of boosting of the signals resulting from the logic combination to a high voltage, so as to generate at the output the high-voltage decoding signals $DAS_{HV}$.

Figure 4:
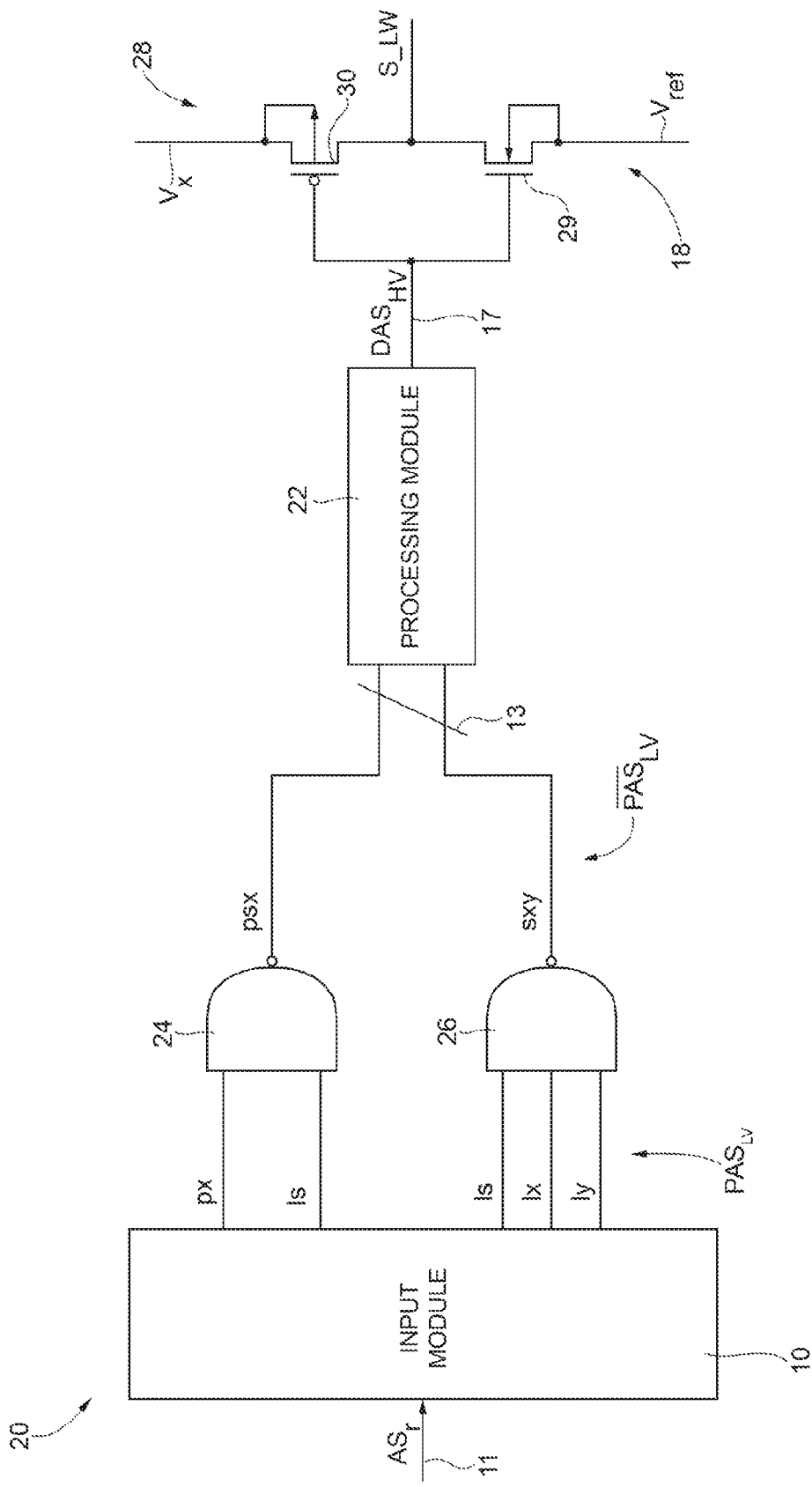
FIG. 4 shows a more detailed block diagram of the row decoder of FIG. 3.

With reference to FIG. 4, a possible embodiment of the row decoder 20 is described in greater detail. A detailed description of the processing module 22 of the row decoder 20 will be provided hereinafter with reference to FIG. 5.

In the embodiment illustrated in FIG. 4, the row-address signals $AS_r$, received by the input module 10 of the row decoder 20 are, for example, 9-bit digital signals. The input module 10 appropriately groups the bits of the row-address signals $AS_r$, into subsets in order to generate the grouped address signals $PAS_{LV}$, here designated by way of example as: px (referred to hereinafter as "first address signals"), lx (referred to hereinafter as "second address signals"), and ly (referred to hereinafter as "third address signals").

For instance, considering a row-address signal $AS_r$<8:16>, the first address signals px may correspond to the three bits $AS_r$<8:10>, the second address signals ly to the two bits $AS_r$<11:12>, and the third address signals lx to the four remaining bits $AS_r$<13:16>.

The input stage 10 further generates, on the basis of the row-address signal $AS_r$, fourth address signals ls.

For instance, the fourth address signals ls may denote the sector of the memory array 2 that is to be selected, the first address signals px a block (in the example of 8 wordlines WL) to be addressed within the sector, and the second and third address signals lx and ly the specific wordline WL to be addressed within the selected block.

The pre-decoding module 12 comprises a plurality of first logic gates 24, of a NAND type with two inputs and one output, each of which receives at the inputs a respective first address signal px and a respective fourth address signal ls, and supplies at the output a respective first pre-decoded address signal, here designated by psx.

In the example described, the first logic gates 24 are eight in number (i.e., in a number equal to the combinations that can be obtained starting from the address signals received at the input).

The pre-decoding module 12 further comprises a plurality of second logic gates 26, of a NAND type with three inputs and one output, each of which receives at the inputs a respective second address signal lx, a respective third address signal ly, and a respective fourth address signal ls, and supplies at the output a second pre-decoded address signal, here designated by sxy.

In the example described, the second logic gates 26 are sixty-four (i.e., once again in a number equal to the combinations that can be obtained starting from the address signals received at the input).

The first transport bus 13 in this case comprises eight lines for the first pre-decoded address signals psx, and sixty-four lines for the second pre-decoded address signals sxy, which are received at the input of the processing module 22.

In this embodiment, the driving module 18 of the row decoder 20 comprises a plurality of inverters 28, each having an input that receives a respective decoded address signal $DAS_{HV}$ and an output that supplies the corresponding biasing signal S_WL for the respective wordline WL of the memory array 2. The number of inverters 28 is equal to the number of the wordlines WL to be addressed, in the example 512.

In detail, each inverter 28 comprises a pull-down transistor 29, of an NMOS type, having a gate terminal that receives the respective decoded address signals $DAS_{HV}$, a drain terminal, which is connected to a respective wordline WL and on which the corresponding biasing signal S_WL is present, and a source terminal receiving a reference voltage $V_{ref}$, which can possibly have a negative value; and a pull-up transistor 30, of a PMOS type, having a gate terminal that receives the respective decoded address signals $DAS_{HV}$, a drain terminal, which is connected to the respective wordline WL and on which the corresponding biasing signal S_WL is present, and a source terminal that receives a boosted voltage, here designated by Vx, for example equal to the high voltage value of 4.5 V.

As emerges clearly, a high output of the inverter 28 corresponds to a low value of the decoded address signals $DAS_{HV}$, with the corresponding biasing signal S_WL equal to the boosted voltage Vx. Instead, a low output of the inverter 28 corresponds to a high value of the decoded address signals $DAS_{HV}$, with the corresponding biasing signal S_WL equal to the reference voltage $V_{ref}$.

Figure 5:
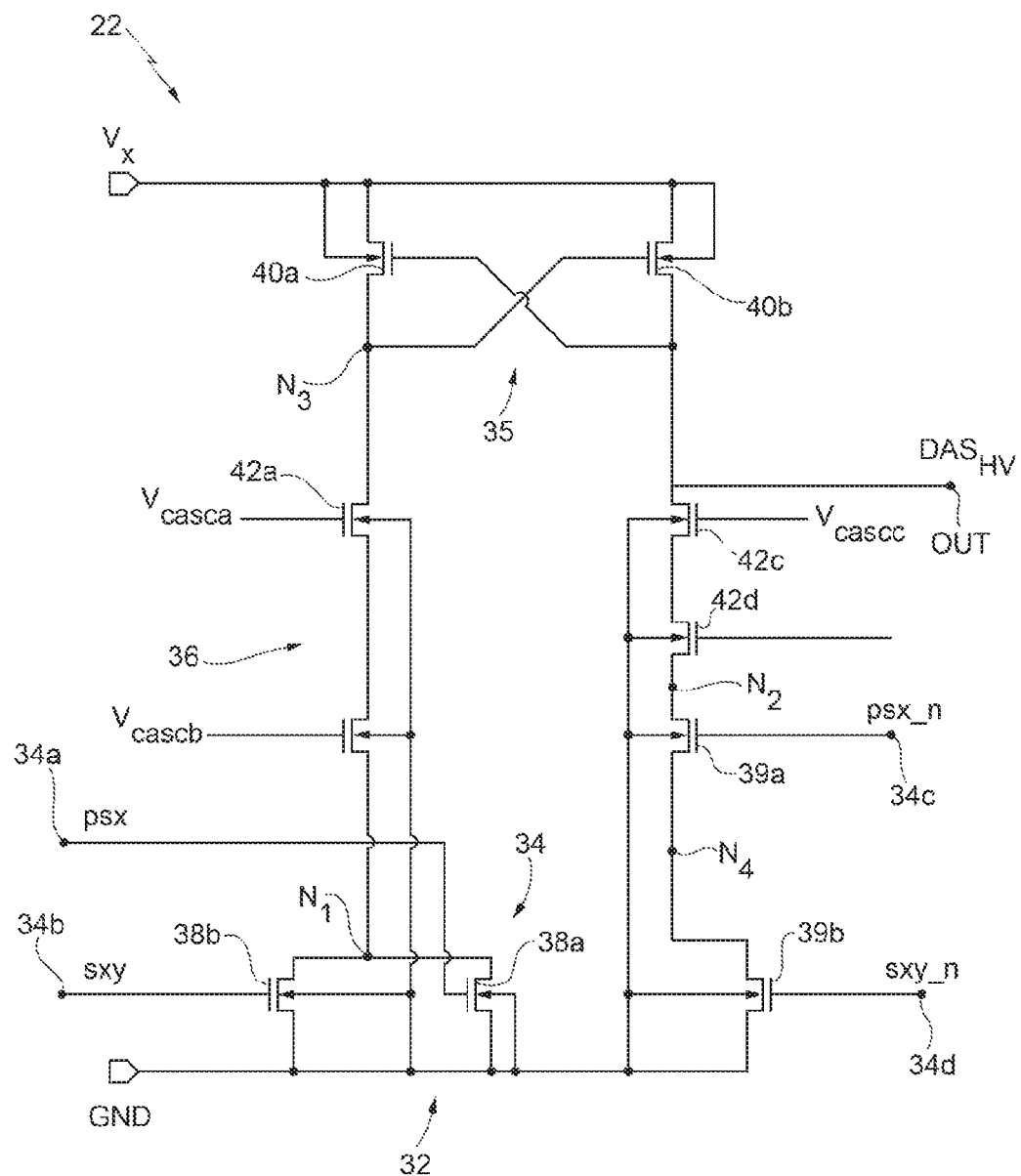
FIG. 5 shows a possible circuit diagram of a processing unit in the row decoder of FIG. 3.

A description of a possible embodiment of the processing module 22 is now made, with reference to FIG. 5.

In particular, FIG. 5 illustrates a processing unit 32 of the processing module 22, which is designed to generate a respective decoded address signal $DAS_{HV}$, starting from a respective first pre-decoded address signal psx and a respective second pre-decoded address signal sxy.

In the embodiment described, the processing module 22 comprises a number of processing units 32 equal to the number of wordlines WL of the addressed sector of the memory array 2. In the example, the number of processing units 32 is consequently equal to 512 (corresponding, further, to the total number of combinations between the first and second pre-decoded address signals psx and sxy).

In detail, each processing unit 32 comprises a decoding stage 34, which operates at low voltage and has a first pair of inputs 34a, 34b that receive the first pre-decoded address signal psx and the second pre-decoded address signal sxy, and a second pair of inputs 34c, 34d that receive a negated version psx_n, sxy_n of the first pre-decoded address signal psx and second pre-decoded address signal sxy (negated version that is appropriately generated by logic-negation gates).

In particular, the decoding stage 34 is configured to perform a logic combination of the OR type of the first pre-decoded address signal psx and of the second pre-decoded address signal sxy to enable generation, on an output terminal out, of the decoded address signal $DAS_{HV}$, which thus has: a high value (high voltage) when any one, or both, of the pre-decoded address signals psx and sxy have a high value; and a low value (ground, GND) when both of the pre-decoded address signals psx and sxy have a low value.

Each processing unit 32 further comprises: a boosting stage 35, which operates at high voltage, operatively coupled to the decoding stage 34 for voltage-boosting the result of the logic-combination operation carried out, and thus generating the decoded address signal $DAS_{HV}$; and a protection stage 36, set between the decoding stage 34 and the boosting stage 35 and configured to protect the same decoding stage 34 from the high voltage present in the boosting stage 35.

In greater detail, the decoding stage 34 comprises a first pair of combination transistors 38a, 38b, of a low-voltage NMOS type (i.e., able to withstand, between the corresponding terminals, voltages in the low-voltage range), which are connected in parallel between a reference-potential terminal (ground GND) and a first combination node $N_1$. A first combination transistor 38a of the pair receives on its own gate terminal the first pre-decoded address signal psx, whereas the second combination transistor 38b of the same pair receives on the respective gate terminal the second pre-decoded address signal sxy.

The decoding stage 34 further comprises a second pair of combination transistors 39a, 39b, of a low-voltage NMOS type, connected in series between the reference-potential terminal (ground GND) and a second combination node $N_2$. A first combination transistor 39a of the pair receives on its own gate terminal the first negated pre-decoded address signal psx_n, whereas the second combination transistor 39b of the same pair receives on the respective gate terminal the second negated pre-decoded address signal sxy_n.

The boosting stage 35 comprises: a first boosting transistor 40a, of a high-voltage PMOS type, connected between a high-voltage terminal, set at the boosted voltage Vx, for example equal to the high voltage with a value of 4.5 V, and an internal node $N_3$; and a second boosting transistor 40b, of a high-voltage PMOS type, connected between the high-voltage terminal, set at the boosted voltage Vx, and the output terminal out of the processing unit 32. Furthermore, the gate terminal of the first boosting transistor 40a is connected to the output terminal out, whereas the gate terminal of the second boosting transistor 40b is connected to the internal node $N_3$.

The protection stage 36 in turn comprises: a first pair of protection transistors 42a, 42b, of an NMOS type (the protection transistor 42a for high voltages, and the protection transistor 42b for low voltages), which are connected in series between the internal node $N_3$ and the first combination node $N_1$ and receive on the respective gate terminal an appropriate control voltage $Vcasc_a$, $Vcasc_b$ (the control voltage Vcascb being, in the example, equal to the supply voltage Vdd, and the control voltage $Vcasc_a$ being higher than the supply voltage Vdd); and a second pair of protection transistors 42c, 42d, of a NMOS types (the protection transistor 42c for high voltages, and the protection transistor 42d for low voltages), which are connected in series between the output terminal out and the second combination node $N_2$ and receive on the respective gate terminal an appropriate control voltage $Vcasc_c$, $Vcasc_d$ (the control voltage $Vcasc_d$ being in the example equal to the supply voltage Vdd, and the control voltage $Vcasc_c$ being higher than the supply voltage Vdd).

During operation, when at least one between the first and second pre-decoded address signals psx and sxy has a high value, or when both of the pre-decoded address signals psx and sxy have a high value, the first combination node $N_1$ is set at the ground potential (given the closed state of one, or both, of the combination transistors 38a, 38b of the first pair). The protection transistors 42a, 42b of the protection stage 36 are driven into the closed state by the respective control voltages $Vcasc_a$, $Vcasc_b$ so that also the internal node $N_3$ is at the ground potential, thus causing turning-on of the second boosting transistor 40b. Consequently, the output terminal out, and thus the value of the respective decoded address signals $DAS_{HV}$, have the boosted voltage Vx (high value).

When, instead, both of the first and second pre-decoded address signals psx and sxy have a low value, the second combination node $N_2$ is set at the ground potential (given the closed state of both of the combination transistors 39a, 39b of the second pair). The protection transistors 42c, 42d of the protection stage 36 are driven into the closed state by the respective control voltages $Vcasc_c$, $Vcasc_d$ so that also the output terminal out goes to ground potential (low value). In this situation, the first boosting transistor 40a is in the closed state so that the internal node $N_3$ goes to the boosted voltage Vx, the second boosting transistor 40b being consequently in the open state.

When the internal node $N_3$ (and likewise the output out) goes to the boosted voltage Vx, the protection transistors 42a, 42b (likewise the protection transistors 42c, 42d) are appropriately driven by the respective control voltages $Vcasc_a$, $Vcasc_b$ ($Vcasc_c$, $Vcasc_d$) for protecting the low-voltage transistors of the decoding stage 34 from the presence of the high voltage, and thus prevent damage thereto.

Figure 6:
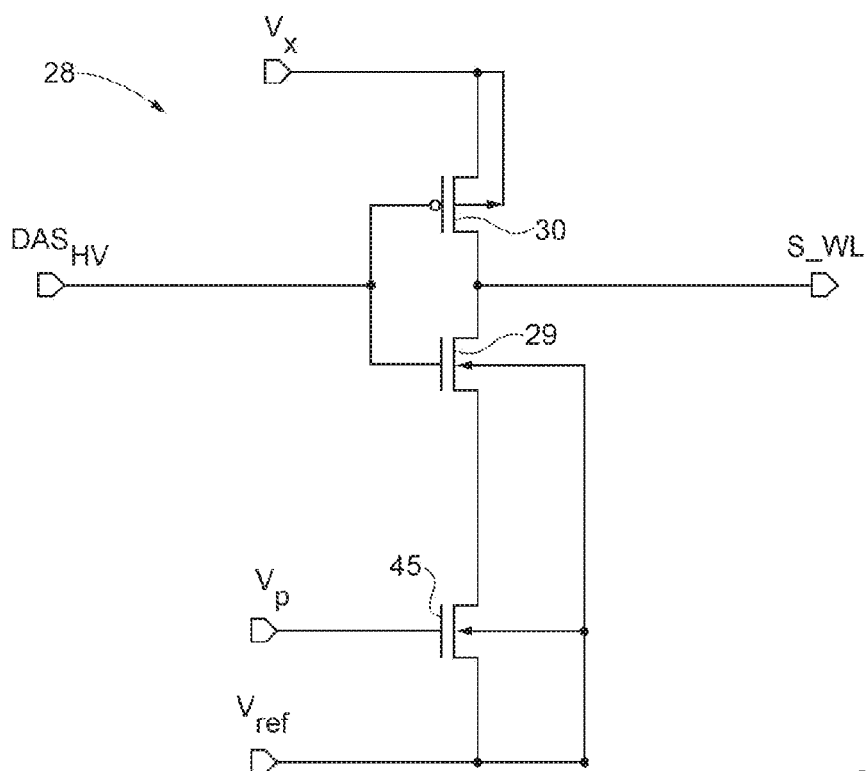
FIG. 6 shows a possible circuit diagram of a driving unit in the row decoder of FIG. 3.

With reference to FIG. 6, a description of a further aspect of the present solution is now made, referring to a different embodiment of the driving module 18 of the row decoder 5, in particular regarding the configuration of the inverters 28.

In this embodiment, each inverter 28 further comprises an interruption transistor 45, of a high-voltage NMOS type, which is set between the source terminal of the pull-down transistor 29 and the terminal set at the reference voltage $V_{ref}$, and has its gate terminal that receives a respective control voltage $V_p$.

In this variant embodiment, the presence of the interruption transistor 45 prevents phenomena of direct conduction of current between the terminal set at the boosted voltage $V_x$ and the terminal set at the reference voltage $V_{ref}$ in the case where the reference voltage $V_{ref}$ is negative and the decoded address signal $DAS_{HV}$ received at the input of the inverter 28 has a low value (ground potential GND). In this case, in fact, both the pull-down transistor 29 and the pull-up transistor 30 are in the closed state, and it is the interruption transistor 45, appropriately driven by the corresponding control voltage $V_p$ (having an appropriate negative value with respect to the reference voltage $V_{ref}$) that prevents the aforesaid phenomenon of direct conduction, by presenting a high resistance to the passage of current.

The advantages of the row decoder are clear from the foregoing description.

In any case, it is once more emphasized that the proposed solution enables a considerable increase in the row-decoding speed in a non-volatile memory device, in particular of a flash type.

The present Applicant has in this regard verified that it is possible to obtain an increase of up to 40% in the row-decoding speed, and an increase greater than 15% in the global access time to the non-volatile memory device.

Furthermore, this solution simplifies the row-decoding architecture, in particular as regards the logic combination of the pre-decoded address signals and shifting of the corresponding voltage levels.

The present Applicant has further found that the solution described does not have a relevant impact, in terms of area occupation, at least for low-density storage devices (for example, less than 2 MB), for which it is consequently particularly advantageous.

In particular, the present Applicant has found that the occupation of area associated to the processing module 22 may be reduced in part, thanks to the possibility for a certain number of processing units 32 (for example, eight) to share some circuit components, for example at least the combination transistor 39b of the second pair of combination transistors of the decoding stage 34. In this case, the node, designated by $N_4$ in FIG. 5, defined between the combination transistors 39a, 39b consequently becomes a virtual node, shared by a number of processing units 32 associated to different wordlines WL of the memory array 2 (in the example, just one combination transistor 39b may be present for eight wordlines WL of the memory array 2).

In conclusion, it is clear that modifications and variations can be made to what has been described and illustrated herein, without thereby departing from the scope of the present invention, as defined in the annexed claims.

In particular, it is evident that, depending on the size of the memory array 2 (and the corresponding division into sectors) a different number of wordlines WL to be addressed may be provided, and, consequently, a different number of pre-decoding and decoding signals.

Furthermore, it is emphasized once again that the solution described may be applied to a wide range of non-volatile storage devices (for example, embedded or stand-alone flash devices), in which it is required to increase the decoding speed, and in general improve the memory-access time.

What is claimed is:

1. A row decoder, for a non-volatile memory device that includes a memory array having memory cells arranged in a plurality of wordlines and is configured to receive a supply voltage, the row decoder comprising:

an input and pre-decoding module, configured to receive address signals and generate pre-decoded address signals at a low voltage that is in the range of the supply voltage;

a processing module, configured to receive the pre-decoded address signals and to both execute a combinational logic operation and boost a voltage of the pre-decoded address signals to generate decoded address signals, wherein the processing module comprises a plurality of processing units, each processing unit comprising a decoding stage that is configured to operate at low voltage and to execute the combinational logic operation of the pre-decoded address signals, and a boosting stage that is configured to operate at high voltage and to boost the voltage of results of the combinational logic operation to generate a respective one of the decoded address signals on an output terminal; and
a driving module, configured to generate biasing signals for biasing the wordlines of the memory array at a high voltage that has been boosted by the processing module to a boosted voltage that is higher than the supply voltage.

2. The row decoder according to claim 1, wherein each processing unit further comprises a protection stage between the decoding stage and the boosting stage, the protection stage configured to protect the decoding stage from the high voltage present in the boosting stage.

3. The row decoder according to claim 2, wherein the combinational logic operation is an OR logic operation between a respective first pre-decoded address signal and a respective second pre-decoded address signal, and wherein the decoding stage comprises:
a first pair of combination transistors, connected in parallel between a reference-potential terminal and a first combination node, a first combination transistor of the first pair receiving on its own gate terminal the first pre-decoded address signal, and a second combination transistor of the first pair receiving on its own gate terminal the second pre-decoded address signal; and
a second pair of combination transistors, connected in series between the reference-potential terminal and a second combination node that is designed to be coupled to the output terminal, a first combination transistor of the second pair receiving on its own gate terminal an inverse of the first pre-decoded address signal, and the second combination transistor of the second pair receiving on its own gate terminal and inverse of the second pre-decoded address signal.

4. The row decoder according to claim 3, wherein the boosting stage comprises:
a first boosting transistor, connected between a high-voltage terminal that is set at the boosted voltage and an internal node that is coupled to the first combination node; and
a second boosting transistor, connected between the high-voltage terminal and the output terminal of the processing unit, a gate terminal of the first boosting transistor being connected to the output terminal and a gate terminal of the second boosting transistor being connected to the internal node.

5. The row decoder according to claim 4, wherein the protection stage comprises:
a protection transistor, which is connected between the internal node and the first combination node and receives on its own gate terminal a control voltage; and
a further protection transistor, which is connected between the output terminal and the second combination node and receives on its own gate terminal an appropriate control voltage.

6. The row decoder according claim 3, wherein a plurality of the processing units share a same second combination transistor in the respective second pairs of combination transistors.

7. The row decoder according to claim 1, wherein the combinational logic operation is an OR logic operation between a respective first pre-decoded address signal and a respective second pre-decoded address signal, and wherein the decoding stage comprises:
a first pair of combination transistors, connected in parallel between a reference-potential terminal and a first combination node, a first combination transistor of the first pair receiving on its own gate terminal the first pre-decoded address signal, and a second combination transistor of the first pair receiving on its own gate terminal the second pre-decoded address signal; and
a second pair of combination transistors, connected in series between the reference-potential terminal and a second combination node that is designed to be coupled to the output terminal, a first combination transistor of the second pair receiving on its own gate terminal an inverse of the first pre-decoded address signal, and the second combination transistor of the second pair receiving on its own gate terminal and inverse of the second pre-decoded address signal.

8. A non-volatile memory device, comprising:
a memory array; and
a row decoder according to claim 1, the row decoder coupled to the memory array and designed to address and bias wordlines of the memory array.

9. A non-volatile memory device comprising:
a memory array having NAND or NOR flash type memory cells arranged in a plurality of wordlines and is configured to receive a supply voltage; and
a row decoder coupled to the memory array and designed to address and bias wordlines of the memory array, the row decoder comprising:
an input and pre-decoding module, configured to receive address signals and generate pre-decoded address signals at a low voltage that is in the range of the supply voltage;
a processing module, configured to receive the pre-decoded address signals and to both execute a combinational logic operation and boost a voltage of the pre-decoded address signals to generate decoded address signals; and
a driving module, configured to generate biasing signals for biasing the wordlines of the memory array at a high voltage that has been boosted by the processing module to a boosted voltage that is higher than the supply voltage.

10. The row decoder according to claim 9, wherein the processing module comprises a plurality of processing units, each processing unit comprising a decoding stage, which is configured to operate at low voltage and to execute the combinational logic operation of the pre-decoded address signals, and a boosting stage, which is configured to operate at high voltage and to boost the voltage of results of the combinational logic operation to generate a respective one of the decoded address signals on an output terminal.

11. The row decoder according to claim 10, wherein the processing units are equal in number to the wordlines of the memory array.

12. The row decoder according to claim 9, wherein the driving module comprises a plurality of inverter units, one for each of respective wordline, wherein each of the inverter units is configured to receive a respective decoded address signal and to supply a respective biasing signal for the respective wordline of the memory array, each inverter unit comprising:
a pull-down transistor, having a gate terminal that receives the respective decoded address signals, a first conduction terminal connected to the respective wordline and present on which is the respective biasing signal, and a second conduction terminal; and
a pull-up transistor, having a gate terminal that receives the respective decoded address signals, a first conduction terminal connected to the respective wordline, and a second conduction terminal that receives the boosted voltage.

13. The row decoder according to claim 12, wherein each inverter unit further comprises an interruption transistor, which is connected between the second conduction terminal of the pull-down transistor and a terminal set at a reference voltage and has a gate terminal that receives a respective control voltage.

14. The row decoder according to claim 9, further comprising a transport bus directly connecting the input and pre-decoding module to the processing module, the transport bus configured to transport the pre-decoded address signals.

15. The row decoder according to claim 9, wherein the input and pre-decoding module comprises:
an input module, configured to receive the address signals and group the address signals into subsets for generating grouped address signals; and
a pre-decoding module, configured to receive the grouped address signals and logically combine the grouped address signals for generating the pre-decoded address signals.

16. The row decoder according to claim 15, wherein the input module comprises:
a plurality of first NAND logic gates, each designed to receive at their input respective address signals from among the grouped address signals and to supply at their output a respective first pre-decoded address signal; and
a plurality of second NAND logic gates, each designed to receive at their input respective grouped address signals and to supply at their output a second pre-decoded address signal.

17. A memory device comprising:
an array of non-volatile memory cells arranged in rows along wordlines of the array and columns along bitlines of the array;
a supply voltage line configured to carry a supply voltage;
a column decoder coupled to the supply voltage line and the columns; and
a row decoder coupled to the rows, the row decoder configured to receive address signals and generate pre-decoded address signals at a low voltage that is in the range of the supply voltage, to perform a combinational logic operation and boost the pre-decoded address signals to generate decoded address signals, and to bias the wordlines of the array at a boosted voltage based on the generated decoded address signals.

18. The memory device according to claim 17, wherein the row decoder includes a plurality of drivers, each coupled to an associated wordline, each driver comprising:
a pull-down transistor, having a gate terminal coupled to receive one of the decoded address signals, a first conduction terminal connected to the associated wordline, and a second conduction terminal;
a pull-up transistor, having a gate terminal coupled to receive the one of the decoded address signals, a first conduction terminal connected to the associated wordline, and a second conduction terminal coupled to receive the boosted voltage; and
an interruption transistor coupled between the second conduction terminal of the pull-down transistor and a ground node.

19. The memory device according to claim 17, wherein the row decoder comprises:
an input and pre-decoding module, configured to receive the address signals and to generate the pre-decoded address signals;
a processing module, configured to receive the pre-decoded address signals and to both execute a logic operation and boost a voltage level of the pre-decoded address signals thereby generating the decoded address signals; and
a driving module, configured to generate biasing signals for biasing the wordlines of the array at boosted voltage.

20. The row decoder according to claim 19, wherein the processing module comprises:
a decoding stage, which is configured to operate at low voltage and to execute the logic operation of the pre-decoded address signals;
a boosting stage, which is configured to operate at high voltage and to boost the voltage level of the pre-decoded address signals; and
a protection stage between the decoding stage and the boosting stage, the protection stage configured to protect the decoding stage from the high voltage present in the boosting stage.

21. A method of operating a non-volatile memory device that includes a memory array having memory cells arranged in a plurality of wordlines, the method comprising:
receiving address signals;
grouping the address signals into subsets for generating grouped address signals;
logically combining the grouped address signals to generate pre-decoded address signals at a low voltage that is in the range of a supply voltage;
in a single step, executing a combinational logic operation and boosting a voltage of the pre-decoded address signals to generate decoded address signals; and
biasing the wordlines of the memory array at a boosted voltage based on the generated decoded address signals.

22. A method of operating a non-volatile memory device that includes a memory array having memory cells arranged in a plurality of wordlines, the method comprising:
receiving address signals;
generating pre-decoded address signals at a low voltage that is in the range of a supply voltage;
in a single step, executing a combinational logic operation and boosting a voltage of the pre-decoded address signals to generate decoded address signals; and
biasing the wordlines of the memory array at a boosted voltage based on the generated decoded address signals, wherein biasing the wordlines of the memory array comprises biasing the wordlines of a NAND or NOR flash memory array.

23. The method according to claim 22, wherein generating the pre-decoded address signals comprises:
grouping the address signals into subsets for generating grouped address signals; and
logically combining the grouped address signals to generate the pre-decoded address signals.

* * * * *